USO08442616B2

(12) United States Patent
Nistler et al.

(10) Patent No.: US 8,442,616 B2
(45) Date of Patent: May 14, 2013

(54) METHOD AND DEVICE FOR MONITORING A RADIO-FREQUENCY TRANSMITTER DEVICE IN A MAGNETIC RESONANCE TOMOGRAPHY SYSTEM

(75) Inventors: Juergen Nistler, Erlangen (DE); Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 555 days.

(21) Appl. No.: 12/641,651

(22) Filed: Dec. 18, 2009

(65) Prior Publication Data

US 2010/0167668 A1    Jul. 1, 2010

(30) Foreign Application Priority Data

Dec. 18, 2008   (DE) .......................... 10 2008 063 630

(51) Int. Cl.
*A61B 5/05*   (2006.01)
(52) U.S. Cl.
USPC ......................................................... 600/410
(58) Field of Classification Search ........................ None
See application file for complete search history.

(56) References Cited

U.S. PATENT DOCUMENTS

| 5,629,653 A * | 5/1997 | Stimson ....................... 333/17.3 |
| 7,649,353 B2 | 1/2010 | Feiweier et al. |
| 2007/0241753 A1* | 10/2007 | Sodickson et al. ............ 324/307 |
| 2008/0231274 A1* | 9/2008 | Fontius et al. ................ 324/309 |
| 2009/0322329 A1 | 12/2009 | Diehl et al. |

\* cited by examiner

*Primary Examiner* — Long V. Le
*Assistant Examiner* — Bo J Peng
(74) *Attorney, Agent, or Firm* — Schiff Hardin LLP

(57) ABSTRACT

In a device for monitoring a radio-frequency transmit device of a magnetic resonance system, having a transmitter antenna system that has a number of transmit channels, a reference scattering parameter matrix of the transmitter antenna system is determined in the unloaded state with no subject present, and a subject-specific scattering parameter matrix of the transmitter antenna system is determined in a state loaded with the subject. time-dependent transmitter amplitude vectors are determined that represent the radio-frequency voltage amplitudes on the individual transmit channels. From the subject-specific scattering parameter matrix, the reference scattering parameter matrix, and the transmit amplitude vectors, radio-frequency power values absorbed at particular transmit times in the subject are determined, from which monitoring values are formed that, when reached, cause operation of the radio-frequency transmit device to be limited during acquisition of magnetic resonance data.

4 Claims, 4 Drawing Sheets

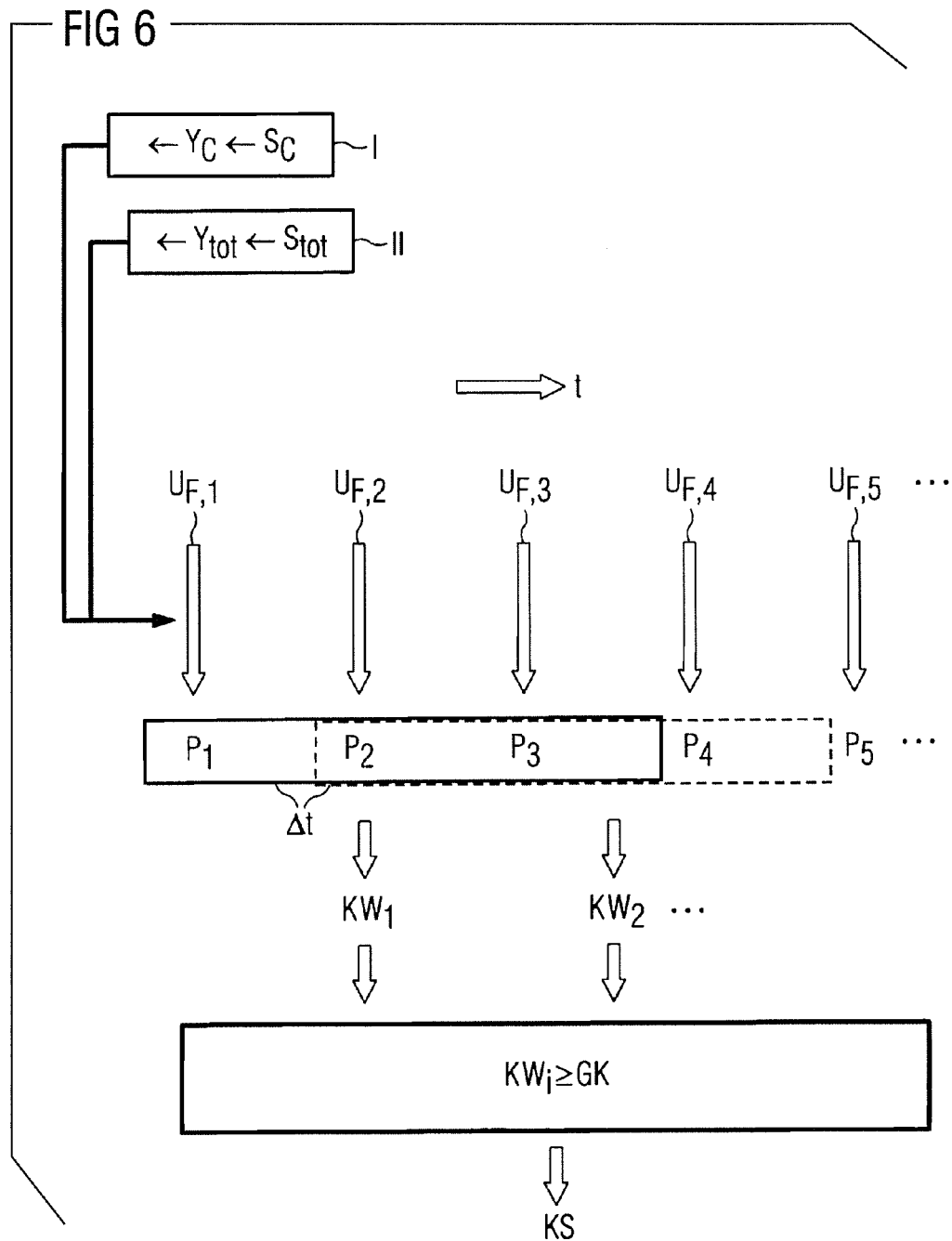

METHOD AND DEVICE FOR MONITORING A RADIO-FREQUENCY TRANSMITTER DEVICE IN A MAGNETIC RESONANCE TOMOGRAPHY SYSTEM

BACKGROUND OF THE INVENTION

1. Field of the Invention

The present invention relates to a method for monitoring a radio-frequency transmitter device of a magnetic resonance tomography system, having a transmit antenna system that has a multiplicity of transmitter channels, during a magnetic resonance measurement of an examination subject. In addition, the present invention relates to a radio-frequency transmit device for such a magnetic resonance tomography system, to a radio-frequency monitoring device for such a radio-frequency transmit device, and to a magnetic resonance tomography system having such a radio-frequency transmitter device.

2. Description of the Prior Art

An imaging using a magnetic resonance tomography system essentially takes place in three steps. First, a strong, stable, homogenous magnetic field, and thus a stable orientation of the protons in the relevant body region, is produced around the body region. This stable orientation is then modified by electromagnetically supplying radio-frequency energy. Third, this energetic stimulation is then terminated and the nuclear resonance signals resulting in the body are measured (detected) using suitable receive coils, in order to permit conclusions to be drawn concerning the tissue in this bodily region. For this purpose, a magnetic resonance tomography system has a large number of components that work together, each of which requires the use of modern, expensive technologies. A central element of a magnetic resonance tomography system, to which the present invention also relates, is the radio-frequency transmitter device, which is responsible for the generation of the radio-frequency pulses that are to be radiated into a body region. The radio-frequency pulses emitted by a radio-frequency power amplifier of the radio-frequency transmitter device are conducted to a transmitter antenna system that radiates the radio-frequency pulses into a bodily region.

In the development and establishment of magnetic resonance tomography systems, in order to ensure patient safety boundary values have been standardized that regulate the maximum radio-frequency radiation into a human body. A typical boundary value is the maximum permissible SAR (Specific Absorption Rate) value. For example, for the valve known as the whole-body SAR it is required that the power absorbed by the patient in a time window averaged over 6 minutes must not exceed a value of 4 W/kg. Measurement devices that can be used to measure the radio-frequency power are provided in the magnetic resonance systems. It is standard for this purpose to use directional couplers in the leads to the antenna system. Because these directional couplers are able to measure only the total power, they always also acquire the power that is converted into lost heat in the apparatus itself, for example in the cables or in the transmitter antenna systems. In order to enable maximum exploitation of the permissible boundary values, and thus to improve the imaging overall and/or to shorten the measurement time, it would be desirable to be able to determine the portion of the transmit power remaining in the transmit antenna system, or to eliminate it from the measurement result. This makes sense in particular if the load on the transmitter antenna system due to the patient is only slight, which is the case, for example, in examinations of the head alone.

For magnetic resonance systems having simple, linearly or circularly polarized antennas, suitable methods are known for determining the antenna losses. However, these methods cannot be transferred directly to transmitter antenna systems having a number of independent transmitter channels, for example to transmitter antenna systems that have a birdcage antenna, in which the individual antenna rods are separately controllable for the production of arbitrary field distributions. In such transmitter antenna systems, in contrast to purely linearly or circularly polarized antennas, the current distribution changes according to the selected controlling, so that as a consequence the losses remaining in the transmitter antenna system can also vary strongly.

SUMMARY OF THE INVENTION

An object of the present invention is to provide a method and device for monitoring a radio-frequency transmit device that reliably prevent the radio-frequency power absorbed by the examination subject from exceeding a prespecified threshold value, and while still enabling the exploitation of the given boundary values as far as possible, even in a transmitter antenna system having a multiplicity of separately controllable transmit channels.

In the method according to the present invention, it is necessary to determine a reference scattering parameter matrix of the transmit antenna system in the unloaded state. Moreover, a subject-specific scattering parameter matrix of the transmit antenna system is determined in a state loaded by the examination subject, for example the body or the relevant body part of the patient. Transmit amplitude vectors are then determined in time-dependent fashion that represent the radio-frequency voltage amplitudes on the individual transmit channels at the respective measurement time. On the basis of the subject-specific scattering parameter matrix, the reference scattering parameter matrix, and the respective transmit amplitude vectors, radio-frequency power values absorbed in the examination subject can then be determined at particular transmit times, namely the times of the measurement of the radio-frequency voltage amplitudes. In this way, it is possible to determine the radio-frequency power actually absorbed in the examination subject at the transmit times indicated by the respective transmit amplitude vectors, without including the power loss remaining in the transmitter antenna system in each case. Based on a large number of determined radio-frequency power values, a number of monitoring values are then formed, and the radio-frequency transmitter device is limited in its functioning when a monitoring value reaches or exceeds a prespecified boundary monitoring value. For example, in this case the radio-frequency transmit device can then be completely deactivated, or the transmit power can be reduced.

The measurement of the reference scattering parameter matrix takes place in the unloaded state, i.e. without loading by the body or by a patient body part that is to be examined, but otherwise under the same conditions as the measurement of the subject-specific scattering parameter matrix. Because, except for the loading by the examination subject, the conditions do not change as a rule, it is usually sufficient to carry out such a reference measurement once and then to use it for a plurality of later magnetic resonance measurements.

The monitoring values can be formed from the radio-frequency power values by averaging over particular prespecified time windows, as is generally standard. In principle, however, it is also possible first to convert the power values into load monitoring values (e.g. SAR values), which represent the biological load on the patient, and then to check these monitoring values to see that they remain within particular boundary values.

Using the method according to the present invention, it is possible to determine the power deposited in the examination subject relatively precisely, and thus to optimally exploit the specified boundary values even in a multichannel transmit antenna system. This method can be implemented online during the measurement; i.e., using this method each of the radio-frequency pulses sent out can be measured precisely during the measurement. In principle, however, this method can also be used ahead of time during a simulation in order to determine, even before the measurement, whether a measurement can be carried out using the planned transmit parameters without expecting boundary values to be exceeded. During such a "look-ahead" monitoring, a limitation of the functioning of the radio-frequency transmit device is to be understood as meaning that, for example, a magnetic resonance measurement that is to be carried out using transmit parameters in which a boundary monitoring value would be exceeded is prevented or is modified, and for example the operator is informed of this via a suitable warning message. That is, the monitoring of the radio-frequency transmit device can take place not only by a direct monitoring signal, but also indirectly through action on a transmit protocol for controlling the magnetic resonance installation or the like. In particular, it is also possible to carry out both such a look-ahead monitoring before the start of a measurement, using the method according to the present invention, and also to additionally use this method to monitor the maintenance of the boundary values online during the measurements.

In addition to the transmit antenna system having a number of transmit channels, a suitable radio-frequency transmit device for carrying out the method according to the present invention requires a radio-frequency power amplifier system having for example a plurality of individually controllable power amplifiers for sending out the radio-frequency pulses via the transmit channels. According to the present invention, the radio-frequency transmit device moreover requires a radio-frequency monitoring device that is coupled to the radio-frequency power amplifier system, a measurement device for measuring radio-frequency voltage amplitudes on the individual transmit channels, and a reference scattering parameter matrix determining device for determining a reference scattering parameter matrix of the transmit antenna system. This reference scattering parameter matrix determining device can for example be an interface that takes a previously determined reference scattering parameter matrix from a memory in which it was previously stored. The measurement for this purpose can take place, for example, ahead of time, using the named measurement device of the radio-frequency monitoring device. For example, the values measured here can be processed to yield the desired scattering parameter matrix and then stored in the memory. According to the present invention, this radio-frequency monitoring device is configured in such a way that during its use as intended a subject-specific scattering parameter matrix of the transmit antenna system is determined in a state in which it is loaded with the examination subject, and that it determines time-dependent transmit amplitude vectors that represent the radio-frequency voltage amplitudes on the individual transmit channels as a function of the transmit time, and that on the basis of the subject-specific scattering parameter matrix, the reference scattering parameter matrix, and the transmit amplitude vector it determines radio-frequency power values absorbed in the examination subject at particular transmit times, and that, based on a multiplicity of determined radio-frequency power values, it forms a number of monitoring values, and that it limits the radio-frequency transmit device in its functioning when a monitoring value reaches or exceeds a prespecified boundary monitoring value.

The radio-frequency monitoring device can be integrated into the radio-frequency transmit device in the form of individual components. However, it is also possible for the radio-frequency monitoring device to be fashioned as a discrete device having the measurement device for measuring the radio-frequency voltage amplitudes on the individual transmit channels, the reference scattering parameter determining device, and a monitoring signal output for monitoring signals for the radio-frequency power amplifier system, or for further components that control this system, in order in this way to enable limitation of the functioning of the radio-frequency transmit device. Existing magnetic resonance tomography systems can be retrofitted with such a discrete radio-frequency monitoring device.

Many of the components of the radio-frequency monitoring device can be realized in the form of software components, in particular the components that are required for the determination of the reference scattering parameter matrix or the subject-specific scattering parameter matrix from the radio-frequency voltage amplitudes. Likewise, the components that operate on the basis of the subject-specific scattering parameter matrix, the reference scattering parameter matrix, and the transmit amplitude vectors, currently measured or determined through simulation, and the calculated radio-frequency power values can be fashioned in the form of a software module. The same also holds for the components that then form the monitoring values from the radio-frequency power values and that compare these monitoring values with prespecified boundary monitoring values. To this extent, a programmable radio-frequency monitoring device already having, alongside a computing unit, a suitable measuring device (for example, a plurality of directional couplers in the individual transmit channels) can be retrofitted with the named software components through an update in order to enable operation in the manner according to the present invention.

Preferably, first a subject-specific conductance matrix is determined from the subject-specific scattering parameter matrix. Moreover, in a corresponding manner a reference conductance matrix of the transmitter antenna system is produced from the reference scattering parameter matrix. The determination of the radio-frequency power values absorbed at particular transmit times in the examination subject then takes place on the basis of the subject-specific conductance matrix and the reference conductance matrix of the transmitter antenna system.

Here, the determination of radio-frequency power value $P_o$ at a measurement time t can preferably be determined according to the following equation:

$$P_o(U_F(t)) = \text{Re}\{\overline{(U_c U_F(t))}^T \cdot (Y_{tot} - Y_c) \cdot (U_c(U_F(t)))\} \quad (1)$$

Here, $U_F$ is a transmit amplitude vector, formed from the radio-frequency voltage values measured in the transmit channels, of the outgoing wave at time t at a particular measurement point in the transmit channel. $Y_{tot}$ is the above-named subject-specific conductance matrix, $Y_c$ is the reference conductance matrix, and $U_c$ is an effective voltage amplitude vector formed from transmit amplitude vector $U_F$.

The way in which effective voltage amplitude vector $U_c$ is formed from transmit amplitude vector $U_F$ depends on the design of the radio-frequency transmit device, in particular on whether it is a radio-frequency transmit device having a matching circuit. Whether such a matching circuit is necessary or not in order to match the transmit antenna system to a reference impedance in turn depends on the particular antenna design.

For a radio-frequency transmit device without a matching circuit, the effective voltage amplitude vector $U_c$ can preferably be determined from transmit amplitude vector $U_F$ as follows:

$$U_c(U_F(t)) = (E + S_{tot}) \cdot U_F(t) \qquad (2)$$

where $S_{tot}$ is a subject-specific scattering parameter matrix and E is the unit matrix. This subject-specific scattering parameter matrix $S_{tot}$ is also the total scattering parameter matrix of the overall system, i.e. of the transmit antenna system with the examination subject situated therein.

For radio-frequency transmit devices that have a matching circuit, the effective voltage amplitude vector $U_c$ is preferably calculated from the transmit amplitude vector $U_F$ as follows:

$$U_c(U_F(t)) = \left(E \cdot \left(1 - \frac{1}{j\omega C_S Z_0}\right) + S_{tot} \cdot \left(1 + \frac{1}{j\omega C_S Z_0}\right)\right) \cdot U_F(t)$$

Here, $S_{tot}$ is the subject-specific scattering parameter matrix, E is the unit matrix, j is the imaginary unit, ω is the transmit frequency, $C_S$ is a matching capacitance, and $Z_0$ is the reference impedance or matching impedance. Reference impedance $Z_0$ is standardly 50Ω.

Preferably, in order to determine the subject-specific scattering parameter matrix and/or in order to determine the reference scattering parameter matrix of the transmit antenna system, a defined radio-frequency signal having a precisely determined form and strength is sent out in chronological succession over each of the separate transmit channels. Here, for each of the transmit channels, i.e. both the transmit channel via which the radio-frequency signal is currently being sent out and also the other transmit channels, at least one voltage value is determined for the returning wave. Preferably, a second voltage value for an outgoing wave is additionally determined for each of the transmit channels. However, this measurement takes place only for the purpose of monitoring, because on all transmit channels except the transmit channel via which the radio-frequency signal is sent out, the voltage value for the outgoing wave should in each case be zero, or at least close to zero.

For this purpose, the radio-frequency transmit device preferably has directional couplers connected in each of the individual transmit channels, e.g. radio-frequency lines running in the components of the transmit antenna system that are allocated to the individual transmit channels. With these directional couplers, in addition it is also possible at chronological intervals, preferably regularly, to measure the voltage values of the outgoing waves on the individual transmit channels in order to determine the transmit amplitude vectors for an online monitoring.

In a preferred embodiment, each of the radio-frequency power amplifiers that emit the radio-frequency pulses via the respective transmit channels can additionally be regulated on the basis of the voltage values determined using the directional couplers. That is, the voltage measurement values of the directional couplers can be used as actual values that are brought into agreement with the target values that correspond to the required signals. In this way, a very simple, more precise controlling of the radio-frequency power amplifiers is also possible.

As explained above, there are various possibilities for forming suitable monitoring values from the radio-frequency power values. In principle, each radio-frequency power value can be taken in itself as a monitoring value. In a preferred variant, a monitoring value is based on the mean value of a large number of radio-frequency power values. Here, the large number of radio-frequency power values can be selected by causing a time window to slide over the radio-frequency power values in the time domain, and using all radio-frequency power values in the time window to form the current monitoring value. Particularly preferably, a sliding mean value is formed. Such a mean value is quite a good measure of the radiation load to which a patient is exposed.

Preferably, various monitoring values are taken into account via different sliding time windows; for example, a short-time monitoring value via a window ten seconds in length and a long-time monitoring value via a window 360 seconds in length. In this way, it can be ensured that on the one hand a peak loading of the patient is avoided, while on the other hand a radiation load does not occur that is too high overall but that always remains just under the peak boundary values.

BRIEF DESCRIPTION OF THE DRAWINGS

FIG. 6 shows a simplified flow diagram of an exemplary embodiment of a method according to the present invention for monitoring a radio-frequency transmit device.

DESCRIPTION OF THE PREFERRED EMBODIMENTS

Figure 1:
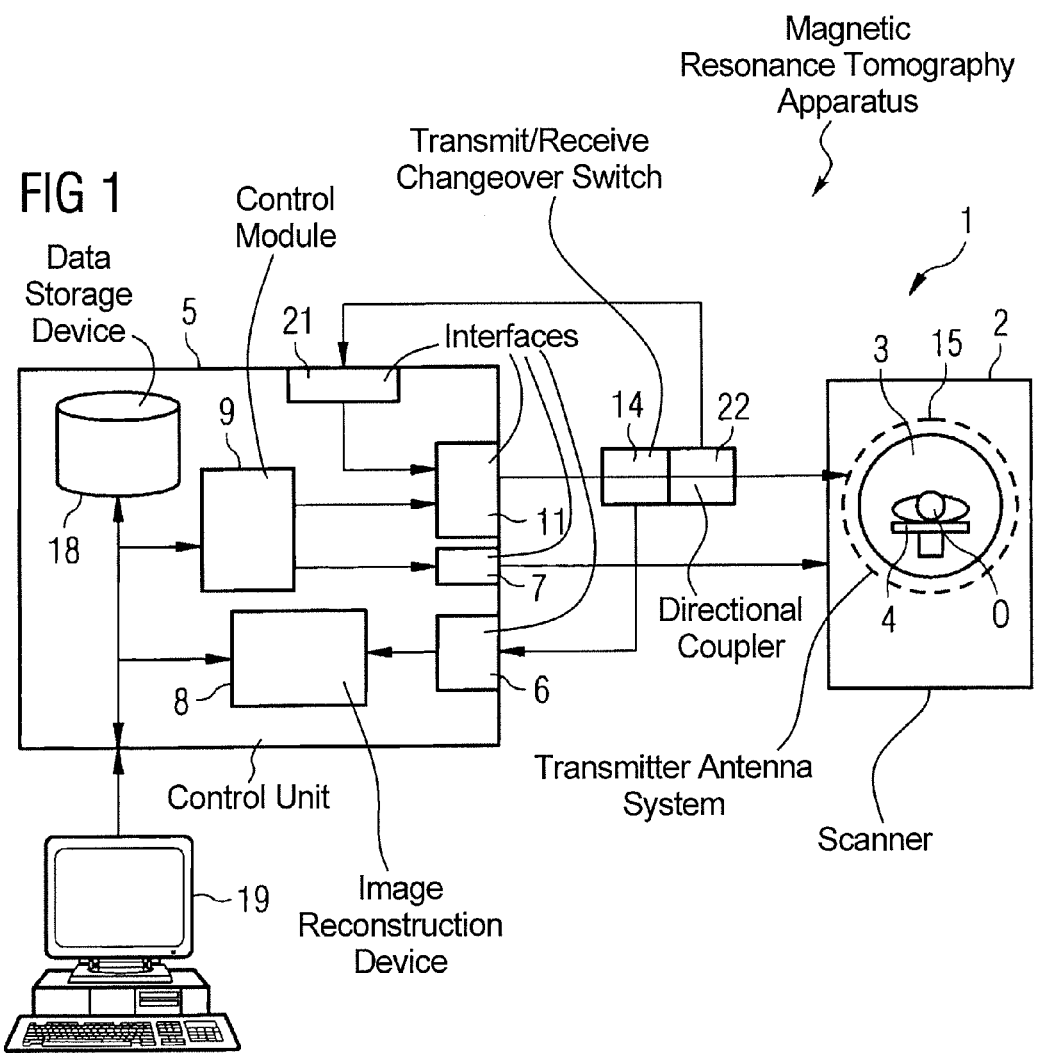
FIG. 1 shows a schematic overview of a magnetic resonance system having a radio-frequency transmit device according to the present invention.

A basic part of the magnetic resonance tomography system 1 shown in highly schematic form in FIG. 1 is the scanner or tomograph 2 that carries out the actual measurements. In this scanner 2 there is situated a measurement space 3, generally called a patient tunnel, in which a patient or subject of examination O can be positioned on a patient bed 4. Here, the scanner 2 has, as a transmit antenna system 15, a whole-body coil 15 having a number of separately controllable transmitter channels in order to enable the formation of arbitrary field distributions in measurement space 3. For example, this can be what is known as a birdcage coil that has N conductor rods that are independently controllable and are situated parallel to one another on a cylinder surface around measurement space 3 and are coupled to one another. However, the present invention is not limited to such transmitter antenna systems. In particular, it is also not necessary that the transmit antenna system form a whole-body coil; rather, it can also be made up of a large number of what are known as local coils, or it can be a head coil or the like having various transmit channels.

In addition, in the scanner 2 there is situated, as is standard, a magnet system having a base field magnet in order to apply a strong base magnetic field in measurement space 3, as well as a number of gradient coils in order to apply the desired magnetic field gradients in each of the three spatial directions. However, for clarity these components are not shown in FIG. 1.

The scanner 2 is controlled by a system control unit 5 that is in turn connected to a terminal 19 via which the entire magnetic resonance tomography system 1 can be operated. The coupling of the scanner 2 to system control unit 5 takes place via a number of interfaces.

One of the interfaces is formed by radio-frequency transmitter device 10, and another by a reception interface 6. The appropriate radio-frequency pulse sequences for a measurement are sent out via radio-frequency transmitter device 10, and the magnetic resonance raw data are entered via the reception interface 6. These components are explained in somewhat more detail below on the basis of FIG. 2.

An interface block 7 represents further interfaces that are necessary for the controlling of further components of the scanner 2, such as the interfaces for controlling the gradient coils, the advance of the patient bed, etc.

As further components, in system control unit 5 a measurement control module 9 that can be controlled by the operator via terminal 19 and a data storage device 18 are shown. On the basis of measurement protocols that are stored for example in data storage device 18 and that can be modified by the operator, measurement control module 9 can specify the parameters so that via the interfaces suitable signals are given to tomograph 2 in order to carry out a measurement with a completely determined pulse sequence, i.e. a radio-frequency pulse sequence and a matching gradient pulse sequence.

Moreover, system control unit 5 here also comprises a reconstruction device 8 that reconstructs the magnetic resonance images from the raw data received by receive interface 6; these images can then be stored in storage device 18 and/or outputted on the display of terminal 19.

It should be noted that such a magnetic resonance tomography system 1, in particular system control device 5, can also have a large number of additional standard components such as interfaces for connection to a network in order to forward the produced images to other stations, etc. However, because the basic design of magnetic resonance systems is known to those skilled in the art, for clarity all such components are not shown in FIG. 1, nor are they discussed in more detail here.

Figure 2:
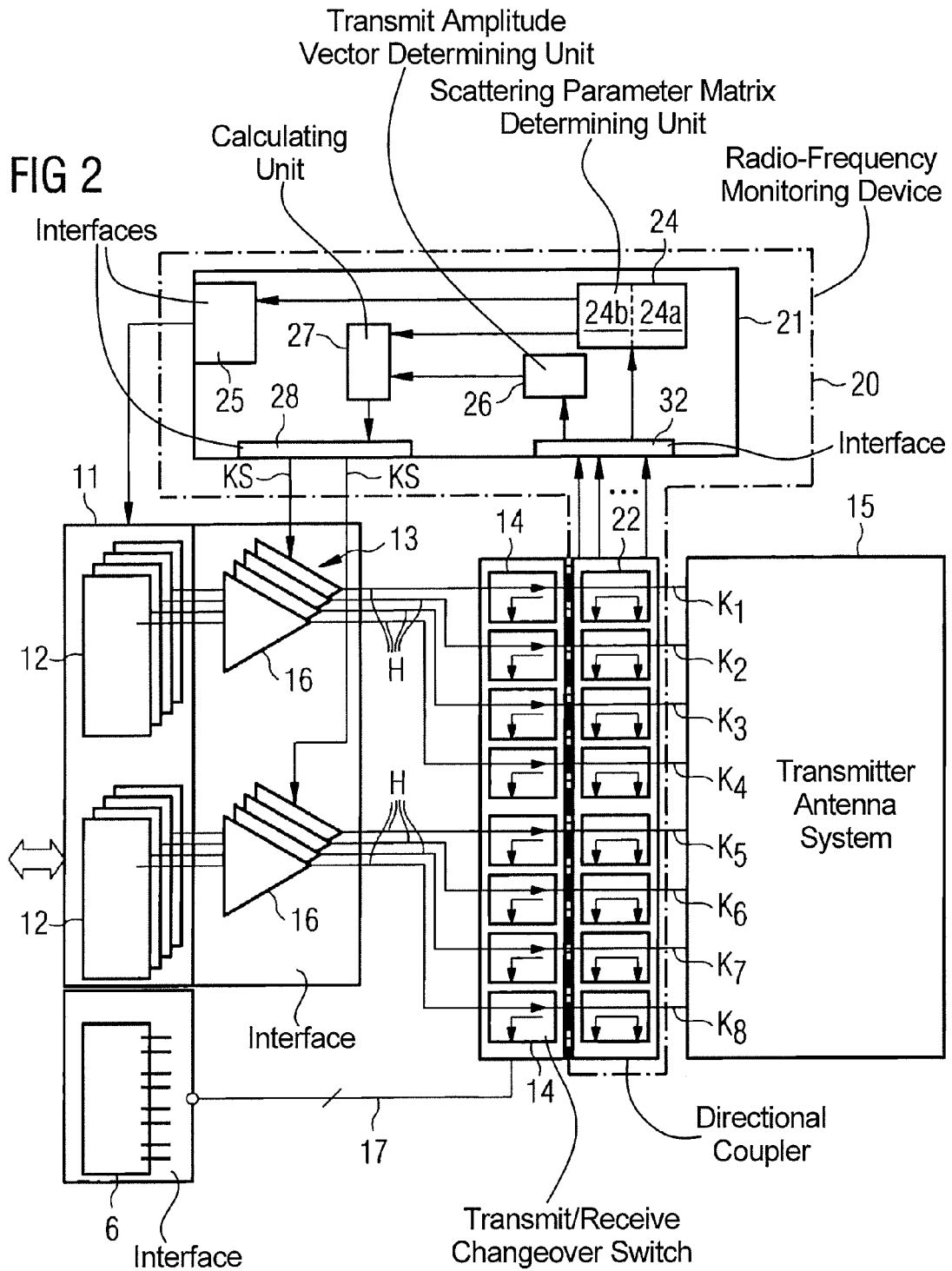
FIG. 2 shows a somewhat more detailed diagram of the design of an exemplary embodiment of a radio-frequency transmit device according to the present invention.

FIG. 2 shows, in more detail, radio-frequency transmitter device 10 according to FIG. 1, shown here for the concrete case of an eight-channel antenna array, i.e. for a transmitter antenna system having eight independent transmitter channels $K_1$, $K_2$, $K_3$, $K_4$, $K_5$, $K_6$, $K_7$, $K_8$. For this purpose, the actual pulse-generating system 11 has eight transmit modules 12 in each of which the radio-frequency signals are produced in the form of low-level signals that are supplied to a radio-frequency amplifier system 13 for amplification. Here, radio-frequency amplifier system 13 has a separate radio-frequency amplifier 16 for each of the transmit channels $K_1$, $K_2$, $K_3$, $K_4$, $K_5$, $K_6$, $K_7$, $K_8$, each such amplifier producing the radio-frequency pulses H that are to be sent out with the desired strength.

In the further lines of individual transmitter channels $K_1$, $K_2$, $K_3$, $K_4$, $K_5$, $K_6$, $K_7$, $K_8$ to transmitter antenna system 15, which is here shown only schematically as a block, in each channel $K_1$, $K_2$, $K_3$, $K_4$, $K_5$, $K_6$, $K_7$, $K_8$ there is situated a transmit/receive changeover switch 14 and a directional coupler 22 that is part of a radio-frequency monitoring device 20. Via transmit/receive changeover switch 14, it is possible to decouple transmit antenna system 15 from pulse-generating system 11, and instead to couple it to receive interface 6 via lines 17 (in FIG. 2, for simplicity instead of eight lines only one line 17 is shown symbolically). In this way, transmit antenna system 15 can also optionally be used as a receive antenna. For example, at first a transmission of radio-frequency pulses H can take place via transmit antenna system 15, and subsequently a changeover takes place so that the same antenna system can be used to receive the magnetic resonance response signal.

Directional couplers 22 are in turn coupled to a directional coupler interface 23 of a monitoring computer 21 of a radio-frequency monitoring device 20, which, in the manner according to the present invention, is used to monitor radio-frequency transmit device 10 and to ensure that the radio-frequency load on a patient being examined remains below prespecified boundary values. This directional coupler interface 23 can be, for example, a multichannel analog/digital converter that converts the analog voltage amplitudes acquired by directional couplers 22 into digital values.

Figure 5:
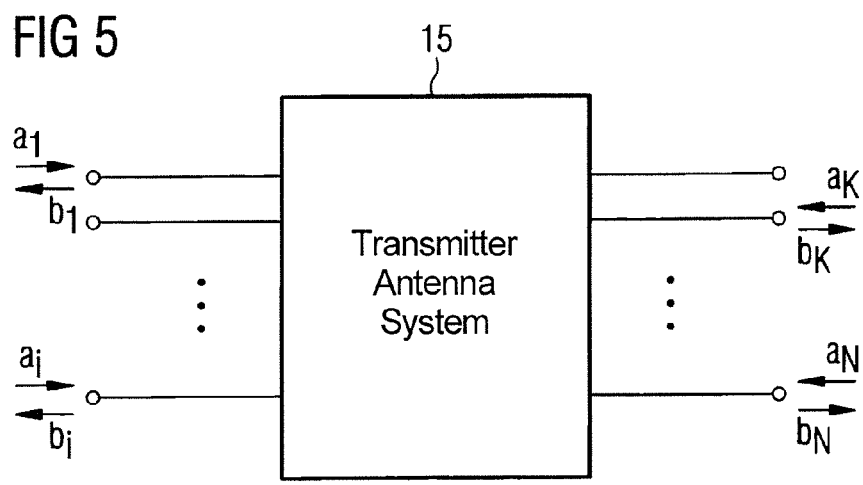
FIG. 5 shows a schematic representation of a transmit antenna system having N transmit channels as an N-gate network, in order to explain the purpose of a scattering parameter matrix.

For a precise radio-frequency load monitoring, at first the scattering parameter matrices of transmit antenna system 15 are determined in the unloaded state and in a state in which the system is loaded with a patient. For the general explanation of a scattering parameter matrix, reference is made to FIG. 5. There, transmitter antenna system 15 is shown in rough schematic form as an N-gate network having N different inputs.

In order to describe such a network, the scattering parameters are used (or, in an N-gate network, an N×N scattering parameter matrix). The scattering parameters link the wave magnitudes $a_1, \ldots, a_i, \ldots, a_k, \ldots, a_N$ going out to the individual gates with the wave magnitudes $b_1, \ldots, b_i, \ldots, b_k, \ldots, b_N$ going away from these gates. Here, for example scattering parameters $s_{ii}$ and $s_{ik}$ result in the following manner:

$$s_{ii}=b_i/a_i$$

$$s_{ik}=b_i/a_k \quad (4)$$

The behavior of the complete N-gate network can be represented in the form of vectors, or a scattering parameter matrix, as follows:

$$\begin{pmatrix} b_1 \\ b_2 \\ \vdots \\ b_N \end{pmatrix} = \begin{pmatrix} s_{11} & s_{12} & \cdots & s_{1N} \\ s_{21} & s_{22} & \cdots & s_{1N} \\ \vdots & & & \\ s_{N1} & & & s_{NN} \end{pmatrix} \cdot \begin{pmatrix} a_1 \\ a_2 \\ \vdots \\ a_N \end{pmatrix} \quad (5)$$

This can be written in abbreviated form as $$B=S \cdot A \quad (6)$$

Here, B is the wave magnitude vector of the returning waves, S is the scattering parameter matrix, and A is the wave magnitude vector of the outgoing waves.

The relation of wave magnitude vectors A and B to the vectors of the voltages, measurable on each of the transmit channels of the transmit antenna system, of the outgoing and returning waves, is as follows:

$$A = \frac{1}{\sqrt{Z_0}} \cdot U_F \quad (7)$$

$$B = \frac{1}{\sqrt{Z_0}} \cdot U_B$$

Here, $U_F$ is the voltage vector of the outgoing wave, i.e. the transmit amplitude vector, and $U_B$ is the voltage vector of the returning wave. Each of these voltages can be measured using directional coupler 22.

Thus, if a reference scattering parameter matrix $S_C$ is to be measured, it is required only that, given an unloaded antenna, a radio-frequency signal is sent successively to the individual channels, and on each of the channels the outgoing and the returning voltage are measured separately. In this way, the wave magnitude vectors A and B, and therefrom, according to Equations (4) and (5), the scattering parameter matrix $S_c$, can be determined for the unloaded case of the antenna.

Likewise, it is then possible, under loading by the patient with which the magnetic resonance measurement is to be carried out later, again to carry out the same measurement procedure as was carried out in the measurement of reference scattering parameter matrix $S_C$, in order in this way to obtain a subject-specific scattering parameter matrix $S_{tot}$ of the overall system, including the subject of examination.

As is shown in FIG. 2, monitoring computer 21 has for this purpose a scattering parameter matrix determining unit 24, this unit being shown in FIG. 2 as a two-part unit 24a, 24b, because it is used both as reference scattering parameter matrix determining unit 24a and as unit 24b for determining the subject-specific scattering parameter matrix. As explained above, however, it is not necessary to determine a reference scattering parameter matrix before each examination; rather, it is sufficient to determine this matrix once and to store it in a memory so that it can be called for a plurality of subsequent measurements. Here, scattering parameter matrix determining unit 24 is coupled to an interface 25 via which commands can be outputted to pulse-generating system 11 so that via the respective channels the desired radio-frequency signals can gradually be outputted for the measurement of the scattering parameter matrix.

From a scattering parameter matrix S, the associated conductance matrix y can be determined according to the following equation:

$$Y = (E-S)(E+S)^{-1} \quad (8)$$

Here E is the unit matrix. Equation (8) can be used both to convert reference scattering parameter matrix $S_C$ into a reference conductance matrix $Y_C$ and to convert subject-specific scattering parameter matrix $S_{tot}$ into a subject-specific conductance matrix $Y_{tot}$.

Using conductance matrix Y, in principle the power P transmitted by the radio-frequency transmit device can be calculated as follows:

$$P = \overline{U}^T \cdot Y \cdot U \quad (9)$$

where U is an effective voltage vector formed from the voltages from the individual transmit channels. It results from the voltage vectors of the outgoing wave and the returning wave according to:

$$U = U_F + U_B \quad (10)$$
$$= \sqrt{Z_O} \cdot (A+B)$$
$$= \sqrt{Z_O} \cdot (A+S \cdot A)$$
$$= \sqrt{Z_O} \cdot (E+S) \cdot A$$

Using Equation (7) (upper part), this equation can be written as follows:

$$U = (E+S) \cdot U_F \quad (11)$$

However, as explained above, the power sent out is actually only partly absorbed by the patient. Another part of the power is lost in the transmit antenna system as lost power.

Figure 3:
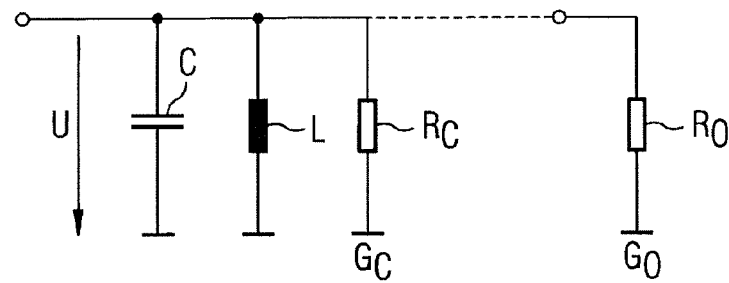
FIG. 3 shows a highly simplified equivalent circuit diagram of a transmit antenna system without a matching circuit.

To explain this, reference is made to the model circuit diagram in FIG. 3. Here, the antenna is shown in simplified form as a parallel oscillation circuit having a capacitance C, an inductance L, and an ohmic resistance $R_C$ whose reciprocal is the conductance $G_C$. Further losses occur in the body of the patient, symbolized here by a resistance $R_0$, because for simplicity it has been assumed here that the patient body has only a purely resistive effect within the antenna system. The conductance $G_O$ of the patient is therefore given here only by this resistance $R_O$. In FIG. 3, as a simplification only one channel of the antenna system is shown. For a complete description of an N-channel transmit antenna system, it would be necessary to use N such circuit diagrams in parallel.

The overall conductance (corresponding to the reference conductance matrix $Y_C$ given N channels) of the unloaded (i.e. without a patient) antenna system shown in FIG. 3 therefore results as follows:

$$Y_C = j\varpi C + \frac{1}{j\varpi L} + G_C \quad (12)$$

In contrast, the conductance with the patient (corresponding to the subject-specific conductance matrix $Y_C$ given N channels) is:

$$Y_C = j\varpi C + \frac{1}{j\varpi L} + G_C + G_O \quad (13)$$

Thus, using Equations (9), (12), and (13), via conductance matrices $Y_{tot}$ and $Y_C$, which can be determined with the aid of the radio-frequency monitoring device according to the present invention, it is also possible to calculate the losses, or power portions remaining in the antenna system, and the radio-frequency power portions remaining in the patient.

Here it must be kept in mind that the power P determined according to Equation (9) is in general complex, and that it is nonetheless sufficient for the sought power deposed in the patient to take into account the real part of P:

$$P = \text{Re}(\overline{U}^T \cdot Y \cdot U) \quad (14)$$

Here, the portion of the power $P_c$ remaining in the antenna system can be written as $$P_C = \text{Re}(\overline{U}^T \cdot Y \cdot U) \quad (15)$$

and the sought portion $P_O$ of the power deposited in the patient can be written as $$P_O = \text{Re}(\overline{U}^T \cdot (Y_{tot} - Y_C) \cdot U) \quad (16)$$

By substituting Equation (11) in Equation (16) there results for the power $P_O$ at the time of transmission or measurement time t (taking into account that scattering parameter matrix S in Equation (11) is in this case scattering parameter matrix $S_{tot}$ of the overall system with patient loading):

$$P_o(U_F(t)) = \text{Re}\{\overline{((E+S_{tot}) \cdot U_F(t))}^T \cdot (Y_{tot} - Y_c) \cdot ((E+S_{tot})U_F(t)\} \quad (17)$$

Thus, using Equation (17), the power $P_O$ deposited in the patient at a transmission time t can be calculated as long as reference conductance matrix $Y_C$, subject-specific conductance matrix $Y_{tot}$, subject-specific scattering parameter matrix $S_{tot}$, and, in addition, each of the transmit amplitude vectors $U_F$ at the relevant time t are known. That is, it is then necessary only to determine the voltage amplitudes on the individual transmit channels for the outgoing wave at for example regular chronological intervals. The power values determined in this way can then be integrated over particular time spans, in order in this way to determine the overall power brought in during a particular time span.

For the measurement of transmit amplitude vector $U_F$, a transmit amplitude vector determining unit 26, shown in FIG. 2, in monitoring computer 21 is used that is likewise connected by interface 23 to directional couplers 22. A calculating unit 27 in monitoring computer 21 is used to carry out, on the basis of the transmit amplitude vector and the scattering parameter matrices or conductance matrices, the above-explained calculations for determining the radio-frequency power $P_O$ deposited in the patient.

Here it is to be noted that Equation (17) corresponds to Equation (1) when the effective voltage amplitude vector $U_C$ has been determined using Equation (2). That is, Equation (17) holds for the case in which no matching circuit is used in the transmit antenna system. If, in contrast, the transmit antenna system has a matching circuit in order to carry out a matching to a reference impedance, for example the standard reference impedance $Z_0$ of 50Ω, a somewhat modified calculation must be carried out.

Figure 4:
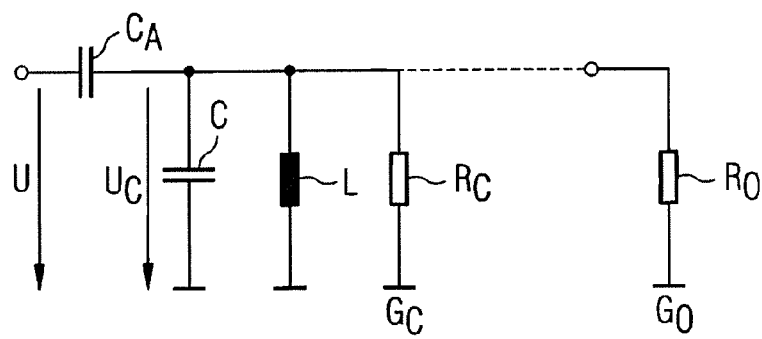
FIG. 4 shows a highly simplified equivalent circuit diagram of a transmit antenna system having a matching circuit.

Concerning this, reference is made to FIG. 4, which shows an equivalent circuit diagram similar to that in FIG. 3.

FIG. 4 differs from FIG. 3 only in that here a matching capacitor $C_A$ is shown in order to symbolize the matching circuit. However, this matching capacitor $C_A$ has the effect that it is not the voltage U, respectively determined at the directional coupler, but rather a voltage $U_A$ modified by the matching circuit, that falls off at the antenna. Thus, in the above-named Equations (11) and (16), it is not possible simply to use the transmit amplitude vector $U_F$ measured at the directional coupler; rather, an effective voltage amplitude vector $U_C$ has to be used that can be calculated from the measured transmit amplitude vector $U_F$ of the outgoing wave and the voltage amplitude vector $U_B$ of the returning wave, as well as the capacitance $C_A$, as follows:

$$U_C = U_F\left(1 - \frac{1}{j\omega C_A \cdot Z_0}\right) + U_B\left(1 + \frac{1}{j\omega C_A \cdot Z_0}\right) \quad (18)$$

However, voltage amplitude vector $U_B$ of the returning wave can be calculated from transmit amplitude vector $U_F$ of the outgoing wave as follows, taking into account Equations (6) and (7):

$$U_B = S \cdot U_F \quad (19)$$

This has the result that the calculations for transmit antenna systems having a matching circuit must be carried out using Equation (1) instead of Equation (16); here, the effective voltage amplitude vector $U_C$ can be calculated from the actually measured voltage amplitude vector $U_F$ of the outgoing wave according to Equation (3).

FIG. 6 again schematically shows an overview of the method. As is shown here, there first takes place, in a first method step I, a determination of the reference scattering parameter matrix $S_C$ and its conversion into a reference conductance matrix $Y_C$. In a further method step II, which is carried out when the patient is already at the desired position in the measurement space, a subject-specific scattering parameter matrix $S_{tot}$ is then determined, and subject-specific conductance matrix $Y_{tot}$ is determined therefrom. Both reference conductance matrix $Y_C$ and subject-specific conductance matrix $Y_{tot}$ are then used in the rest of the method.

During the measurement time, radio-frequency pulses are sent out (not shown) at chronological intervals. Moreover, at regular chronological intervals during the sending out of the radio-frequency pulses, with the aid of directional coupler 22 the voltage amplitudes of the circulating waves on the individual transmit channels $K_2$, $K_3$, $K_4$, $K_5$, $K_6$, $K_7$, $K_8$ are determined, and a respective transmit amplitude vector $L_{F1}$, $L_{F2}$, $U_{F3}$, . . . is determined for the various times t. These transmit amplitude vectors $U_{F1}$, $U_{F2}$, $U_{F3}$, . . . are then converted, according to the above Equations (16) or (1) and (3), into radio-frequency power values $P_1$, $P_2$, $P_3$, . . . , which indicate the radio-frequency power remaining in the patient.

From these radio-frequency power values, monitoring values $KW_1$, $KW_2$, . . . are formed in time-dependent fashion by averaging, via a prespecified time window $\Delta t$, all radio-frequency power values $P_1$, $P_2$, $P_3$, . . . , lying in time window M. Here, time window $\Delta t$ slides with time over the determined radio-frequency power values $P_1$, $P_2$, $P_3$, that is, monitoring values $KW_1$, $KW_2$, . . . , correspond to a sliding mean value over a particular measurement time span $\Delta t$.

The monitoring values $KW_1$, $KW_2$, . . . , $KW_i$ determined in this way are each compared to a boundary monitoring value GK. If it is determined that a monitoring value $KW_i$ reaches or exceeds the boundary monitoring value, a monitoring signal KS is outputted that ensures that the power level of the radio-frequency power amplifier is reduced. In addition, monitoring computer 21 can, as shown in FIG. 2, have a monitoring signal interface 28 via which, initiated by calculating unit 27 (which for example also implements the comparison of the determined monitoring values with the boundary monitoring values), corresponding monitoring signals KS are outputted to the individual radio-frequency amplifiers 16. In FIG. 2, for clarity only two lines are shown via which monitoring signals KS are communicated to radio-frequency amplifiers 16. In reality, each radio-frequency amplifier 16 is preferably capable of being controlled separately.

The method has been described on the basis of the Figures for an online monitoring during a measurement. As mentioned, however, it is also possible to use the method for monitoring in the context of a simulation ahead of time. For this purpose, in principle monitoring computer 21 can also be used. It is necessary only that, in addition to the reference scattering parameter matrix, which may already be measured, a subject-specific scattering parameter matrix be specified, for example on the basis of estimates or measurements of patients, or of patients having similar bodily volume. In addition, on the basis of the planned radio-frequency signals, corresponding voltage values for the outgoing voltages must be given to monitoring computer 21. If this is the case, then, as in an online determination, the radio-frequency power expected to be deposited in the patient can also be estimated, and it can thus be determined ahead of time whether an exceeding of boundary values is to be expected. If this is the case, then via the monitoring signal interface a corresponding warning is outputted as a monitoring signal to the operator, or via a monitoring signal such a measurement using the set parameters can be prevented from being carried out at all.

As noted above, the preceding method, described in detail, as well as the presented radio-frequency transmit device, or radio-frequency monitoring device, are exemplary embodiments that can be modified in a wide variety of ways by someone skilled in the art without departing from the scope of the present invention. Although the present invention has been described above on the basis of a magnetic resonance tomography system in the field of medicine, the present invention can also be used in magnetic resonance tomography systems used for scientific and/or industrial purposes. For the sake of completeness, here it is also to be noted that the use of the indefinite article "a" does not exclude the possibility that the relevant features may also be multiply present. Likewise, the term "unit" does not exclude the possibility that such a unit may be made up of a plurality of components, which may also be spatially distributed if warranted.

Although modifications and changes may be suggested by those skilled in the art, it is the intention of the inventors to embody within the patent warranted hereon all changes and modifications as reasonably and properly come within the scope of their contribution to the art.

We claim as our invention:

1. A radio-frequency transmitter device for a magnetic resonance apparatus, comprising:
   a transmitter antenna system comprising a plurality of transmitter channels; and
   a monitoring device that monitors transmission by said transmitter antenna system during acquisition of magnetic resonance data, said monitoring device comprising a processor configured to operate said magnetic resonance apparatus and said transmitter antenna system prior to introducing an examination subject into the magnetic resonance apparatus, to determine a reference scattering parameter matrix of the transmitter antenna system in an unloaded state, and to operate said transmission antenna system and said magnetic resonance apparatus, and, after introduction of an examination subject into the magnetic resonance apparatus, to execute a procedure, in which said transmitter antenna system participates, to acquire magnetic resonance data from the examination subject, and to determine a subject-specific scattering parameter matrix of the transmitter antenna system in a state loaded by the examination subject, and to automatically determine time-dependent transmitter amplitude vectors for each of said transmitter channels that represent radio-frequency voltage amplitudes in the respective transmitter channels, and to use said subject-specific scattering parameter matrix and said reference scattering parameter matrix and said transmitter amplitude vectors to determine radio-frequency power values that are absorbed by the examination subject at respective transmit times in said procedure, and to form a plurality of monitoring values based on the determined radio-frequency power values, and to limit operation of said radio-frequency transmitter device during the acquisition of said magnetic resonance data when one of said monitoring values equals or exceeds a predetermined boundary monitoring value, wherein the scattering parameter matrix is obtained by comparing wave magnitude vectors of outgoing waves and returning waves of said transmission antenna system, and wherein the wave magnitude vectors of outgoing waves and returning waves are obtained from outgoing and returning voltages of the transmission antenna system.

2. A radio-frequency transmitter device as claimed in claim 1 wherein said monitoring device comprises a measurement device comprising directional couplers respectively connected to said transmitter channels that measure said radio-frequency voltage amplitudes in the respective transmitter channels.

3. A radio-frequency monitoring device for monitoring a radio-frequency transmitter device in a magnetic resonance apparatus, during a procedure comprising acquisition of magnetic resonance data, involving the transmitter device, in the magnetic resonance system, said radio-frequency transmitter device comprising a transmitter antenna system comprising a plurality of transmitter channels, said monitoring device comprising:
   a measurement device configured to determine, prior to introducing an examination subject into the magnetic resonance apparatus, a reference scattering parameter matrix of the transmitter antenna system in an unloaded state;
   said measurement device being configured to determine, after introduction of an examination subject into the magnetic resonance apparatus, a subject-specific scattering parameter matrix of the transmitter antenna system in a state loaded by the examination subject during said procedure;
   a processor configured to automatically determine time-dependent transmitter amplitude vectors for each of said transmitter channels that represent radio-frequency voltage amplitudes in the respective transmitter channels;
   said processor being configured to use, said subject-specific scattering parameter matrix and said reference scattering parameter matrix and said transmitter amplitude vectors to determine radio-frequency power values that are absorbed by the examination subject at respective transmit times;
   said processor being configured to form a plurality of monitoring values based on the determined radio-frequency power values; and
   said processor being configured to limit operation of said radio-frequency transmitter device during the acquisition of said magnetic resonance data when one of said monitoring values equals or exceeds a predetermined boundary monitoring value, wherein the scattering parameter matrix is obtained by relating wave magnitude vectors of outgoing waves and returning waves of said transmission antenna system, and wherein wave magnitudes of outgoing waves and returning waves are obtained from outgoing and returning voltages of the transmission antenna system.

4. A magnetic resonance system comprising:
   a magnetic resonance data acquisition unit;
   a radio-frequency transmitter device in said magnetic resonance data acquisition unit, comprising a transmitter antenna system comprising a plurality of transmitter channels; and
   a monitoring device that monitors transmission by said transmitter antenna system during a procedure comprising acquisition of magnetic resonance data, said monitoring device comprising a processor configured to operate said magnetic resonance data acquisition unit and said transmitter antenna system prior to introducing an examination subject into the magnetic resonance data acquisition unit, to determine a reference scattering parameter matrix of the transmitter antenna system in an unloaded state, and to operate said magnetic resonance data acquisition unit and, said transmission antenna system, after introduction of an examination subject into the magnetic resonance data acquisition unit, to execute a procedure, in which said transmitter antenna system participates, to acquire magnetic resonance data from the examination subject, and to determine a subject-specific scattering parameter matrix of the transmitter antenna system in a state loaded by the examination subject, and to automatically determine time-dependent transmitter amplitude vectors for each of said transmitter channels that represent radio-frequency voltage amplitudes in the respective transmitter channels, and to use said subject-specific scattering parameter matrix and said reference scattering parameter matrix and said transmitter amplitude vectors to determine radio-frequency power values that are absorbed by the examination subject at respective transmit times in said procedure, and to form a plurality of monitoring values based on the determined radio-frequency power values, and to limit operation of said radio-frequency transmitter device during the acquisition of said magnetic resonance data when one of said monitoring values equals or exceeds a predetermined boundary monitoring value, wherein the scattering parameter matrix is obtained by relating wave magnitude vectors of outgoing waves and returning waves of said transmission antenna system, and wherein wave magnitudes of outgoing waves and returning waves are obtained from outgoing and returning voltages of the transmission antenna system.

* * * * *